United States Patent
Jain et al.

(10) Patent No.: US 8,689,068 B2
(45) Date of Patent: Apr. 1, 2014

(54) LOW LEAKAGE CURRENT OPERATION OF INTEGRATED CIRCUIT USING SCAN CHAIN

(75) Inventors: Siddhartha Jain, Noida (IN);
Himanshu Goel, Ghaziabad (IN);
Himanshu Kukreja, New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 200 days.

(21) Appl. No.: 13/305,702

(22) Filed: Nov. 28, 2011

(65) Prior Publication Data

US 2013/0139013 A1 May 30, 2013

(51) Int. Cl.
*G01R 31/28* (2006.01)

(52) U.S. Cl.
USPC ........................................................ 714/729

(58) Field of Classification Search
None
See application file for complete search history.

(56) References Cited

U.S. PATENT DOCUMENTS

| | | | |
|---|---|---|---|
| 6,711,708 B1 * | 3/2004 | Shimomura | 714/727 |
| 7,233,197 B2 * | 6/2007 | Marshall et al. | 327/566 |
| 7,315,201 B2 * | 1/2008 | Marshall et al. | 327/566 |
| 7,571,402 B2 | 8/2009 | Hossain | |
| 2005/0024121 A1 * | 2/2005 | Marshall et al. | 327/379 |
| 2005/0050416 A1 * | 3/2005 | Hossain | 714/726 |
| 2009/0193307 A1 * | 7/2009 | Hossain | 714/731 |

OTHER PUBLICATIONS

Abdollahi, A.; Fallah, F.; Pedram, M.; "Leakage current reduction in sequential circuits by modifying the scan chains"; IEEE Proceedings Fourth International Symposium on Quality Electronic Design, 2003; pp. 49-54.

* cited by examiner

*Primary Examiner* — Daniel McMahon
(74) *Attorney, Agent, or Firm* — Charles Bergere

(57) ABSTRACT

An integrated circuit (IC) having a low leakage current mode of operation has a number of modules for running respective applications. The modules have respective cells and respective test scan chain elements. The IC also has a controller for configuring an active module to operate in a functional mode and a selected inactive module to operate in a low leakage current mode. Configuring the selected inactive module to operate in low leakage current mode includes enabling scan mode of the selected inactive module, and applying a low leakage vector of input signals from the controller to the cells of the inactive module using the scan chain. Functional data outputs of the inactive module are disabled during low leakage current mode. In the meantime, the active modules continue to operate in the functional mode.

14 Claims, 3 Drawing Sheets

PRIOR ART

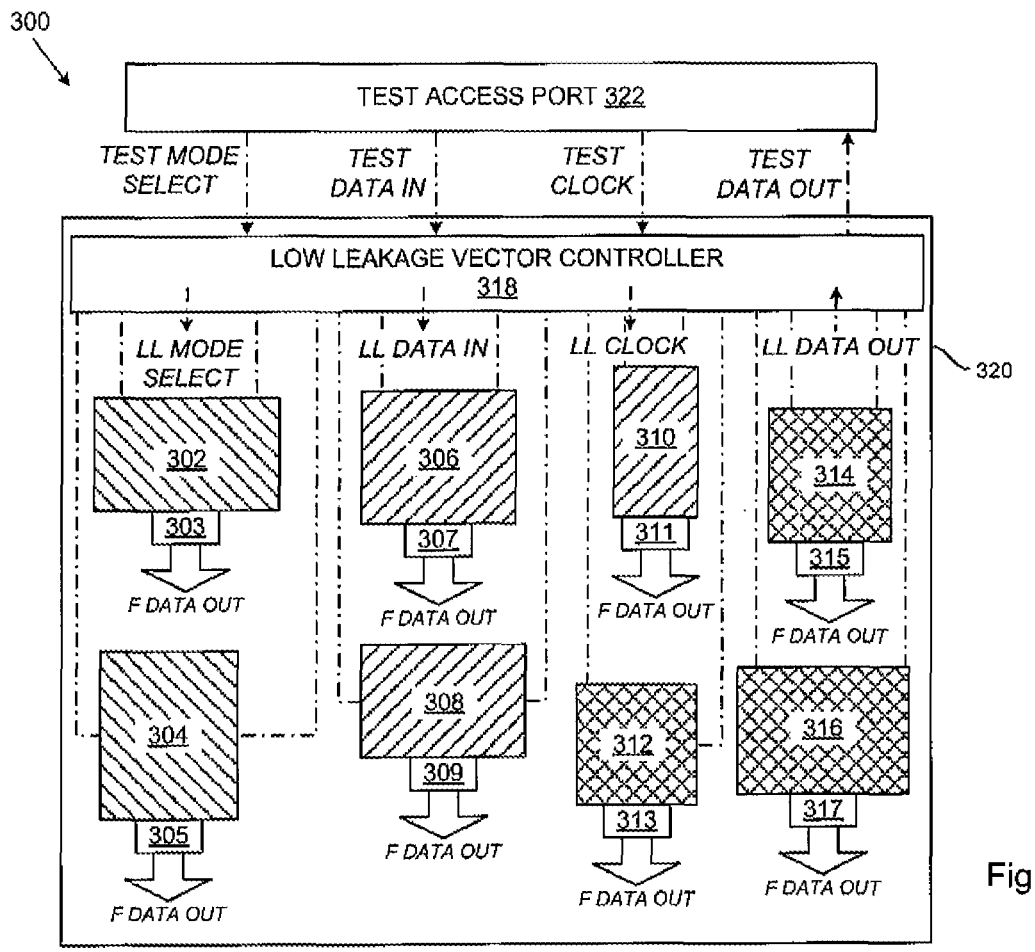
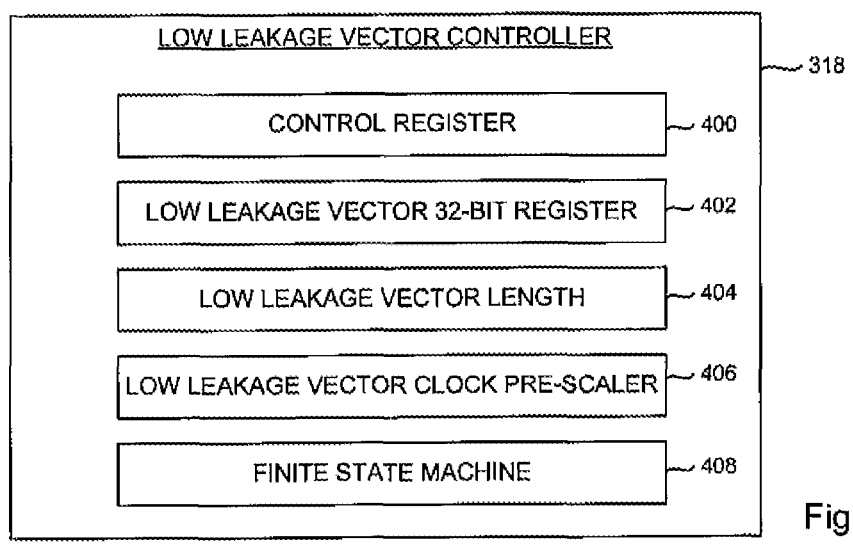
Fig. 3
Fig. 4

LOW LEAKAGE CURRENT OPERATION OF INTEGRATED CIRCUIT USING SCAN CHAIN

BACKGROUND OF THE INVENTION

The present invention is directed to integrated circuits and more particularly, to reducing leakage current of an integrated circuit while the integrated circuit is performing tasks.

Integrated circuit (IC) power consumption includes dynamic power consumption by active modules of the IC and static power consumption by both the active and inactive modules of the IC. Dynamic power consumption can be reduced by techniques such as frequency and voltage scaling for the active modules and by gating (turning off) the clock signals for inactive modules. Although static power consumption can represent a significant proportion of the total power consumption of an IC, these techniques do not reduce static power consumption.

Most ICs these days include built-in methods for testing the cells and modules from which the IC is constructed. One well known method is known as "scan" or scan-set testing. In scan-set testing, flip-flops or latches of the IC are connected in one or more daisy chains. A test vector is then propagated from the first latch in the chain to the last latch in the chain and then to an output pad. Passing various test vectors through the scan chain allows much of the logic or circuitry of the IC to be tested. An example of scan chain technology is the IEEE 1149.1 Standard Test Access Port and Boundary-Scan Architecture, commonly known as Joint Test Action Group (JTAG). In a normal, functional mode of operation, the latches receive and store values depending on the applications being executed by the IC, while in scan mode, input and output latches of the cells are connected so that, at each clock cycle, the latches store the next functional data input or output of the cell so that during scan testing, the test vectors can be propagated through the scan chains, with the first and last latches of the chain connected to an externally accessible JTAG port. Test input data, known as a test vector, is then applied to the JTAG port and shifted through the chain of registers under the control of test clock signals. Once the test signals for each latch are correctly positioned in the scan chain, the circuit is placed in normal operating mode for a defined number of operating clock cycles. The circuit is then returned to test mode and the states of the output latches are shifted through the scan chain and recovered at the JTAG port as test results. Typically, the same clock gating logic that controls the functional clock signals is used to control the application of test scan clock signals during scan testing, controlled by the automatic test equipment (ATE).

The leakage currents of gates can vary considerably as a function of the values ('0' or '1') of the voltage signals applied to the gates. For example, a gate that receives a value of '1' may have greater leakage current than if the same gate was receiving a value of '0'. The leakage currents of cells of ICs vary considerably as a function of the voltages applied to the cell inputs. FIG. 1 illustrates a basic NAND gate 100 as an example of a conventional standard cell. The NAND gate 100 has two PMOS transistors 102 and 104 whose source-drain paths are connected in parallel between a positive supply rail $V_{DD}$ and an output node 106 and two NMOS transistors 108, 110 whose source-drain paths are connected in series between the output node 106 and ground. Input voltages A are applied to the gates of the transistors 102 and 110 and input voltages B are applied to the gates of the transistors 104 and 108. The assertion of both the input voltages A and B at positive values leads to the greatest leakage current in the NAND gate, since the NMOS transistors 108 and 110 are switched ON and the leakage current flows through the resistance of the two OFF PMOS transistors 102 and 104 in parallel. A smaller leakage current is obtained if one of the input voltages A and B is asserted and the other de-asserted, since one of the PMOS transistors 102 and 104 is ON and the leakage current corresponds to the resistance of the single one of the NMOS transistors 108 and 110, which is OFF. The smallest leakage current is obtained if both the input voltages A and B are de-asserted, since the leakage current corresponds to the resistances of both the OFF NMOS transistors 108 and 110 in series. Table 1 shows typical values obtained.

TABLE 1

| Inputs | Leakage current (infinite load) | % of smallest |
|---|---|---|
| A = 0, B = 0 | $7.96 * 10^{-9}$ | |
| A = 1, B = 0 | $4.58 * 10^{-8}$ | 575% |
| A = 0, B = 1 | $5.62 * 10^{-8}$ | 706% |
| A = 1, B = 1 | $1.88 * 10^{-7}$ | 2361% |

Statistically the leakage current of the NAND gate 100 can be reduced, by a factor of up to 23 by applying voltages A=0, B=0 to the inputs of the NAND gate when it is not currently active, instead of leaving the inputs at the values (such as A=1, B=1) that they had after the last active state of the gate. Major reductions in leakage current can similarly be obtained for other types of cells such as NOR gates, XOR gates or multiplexers.

FIG. 2 illustrates a conventional electronic module 200 in an IC having individual data processing cells 202 and respective input and output latches 204. The latches 204 can also be connected in a test scan chain. In this example, each of the test scan chain elements includes a multiplexer 206 in addition to its latches 204. Each of the multiplexers 206 has an output connected to an input of the associated latch 204 and a first input connected to the output of the latch of the previous test scan chain element, except for the first and last test scan chain elements. The first input of the multiplexer of the first input test scan chain element receives a test data input signal TEST IN from the test access port. The output of the latch of the last test scan chain element provides a test data output signal TEST OUT to the test access port. The multiplexers receive from the test access port control signals TEST, comprising test mode and scan enable signals. Each of the input latches 204 has an output connected to a data input of the associated cell 202 and a second input of the associated multiplexer 206 connected to receive a functional data signal D. Each of the output latches 204 has its output connected to provide a data output signal D', and a second input of the associated multiplexer 206 connected to a data output of the associated cell 202. The latches change state in response to the functional or test clock signals they receive, which also synchronize the operation of the associated cells 202.

In functional mode, the test enable signals set the multiplexers 206 to pass the data input and output signals D and D' to and from the active latches 204 and data processing cells 202 without affecting the operation of the cells. The test mode signals set the clock gating logic to receive the functional clock signals. The operation of the active latches 204 and data processing cells 202 is synchronized by the functional system clock signals CLK. The functional clock signals for the inactive latches 204 and data processing cells 202 are gated, so that the latches, and the cells, do not change state, saving dynamic power consumption.

In test mode, the test mode signals set the clock gating logic to receive the test clock signals, which replace the functional clock signals CLK. The clock gating logic applies the test clock signals at the appropriate periods to the relevant latches which form the scan chain. The test enable signals set the multiplexers 206 to connect the scan chain elements in a scan chain, forming a shift register. Test data input signals TEST IN forming a test vector are then shifted through the shift register in synchronization with the test clock signals. Simultaneously, test data output signals TEST OUT are shifted through the shift register and can be recovered at the test access port. Once the test vector is correctly positioned in the scan chain, the scan chain is placed in normal operating mode for one (or more) cycles of the functional clock signals CLK. The circuit is then returned to test mode and the states of the output latches are shifted through the scan chain by the test clock signals and recovered at the test access port as test results.

The electronic module 200 may have a full boundary scan chain or the scan chain may cover only some of the inputs and outputs. Each scan chain element may connect with an individual cell or may connect with traces having more than one cell. The electronic module 200 also may include more than one scan chain and the scan chain or chains of more than one module may be connected in series to form a single scan chain. The test signals TEST and TEST IN may be provided by an ATE (not shown). The test signals may include test instruction codes to modify interconnections between scan chains.

It is possible to use the scan chain to introduce a low leakage vector (LLV) having the voltages for the inputs of the different cells of the circuit that place the cells in low leakage current configuration, as proposed by Abdollahi et al. in their paper "Leakage Current Reduction in Sequential Circuits by Modifying the Scan Chains", Proceedings Fourth International Symposium on Quality Electronic Design, 2003; Page(s): 49-54. Abdollahi et al. propose scanning in the LLV while the IC is in a sleep or low power mode. While this is a good improvement in reducing static power consumption, it does not reduce static power consumption while the IC is in normal, functional mode.

It would be advantageous to reduce the leakage power of an IC even while the IC is performing tasks.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

FIG. 3 is a schematic block diagram of an apparatus including an IC having a low leakage current mode of operation in accordance with one embodiment of the invention, given by way of example;

FIG. 4 is a schematic block diagram of a controller in the IC of FIG. 3; and

DETAILED DESCRIPTION OF PREFERRED EMBODIMENTS OF THE INVENTION

According to the present invention, the leakage current of an IC is reduced substantially by applying suitable low leakage vectors ('LLVs') through scan chains to the inputs of inactive cells, instead of leaving the inputs at the values that they had after their last active state, while the IC is operating in a normal, functional mode. The LLVs preferably are stored in an off-chip memory and, as discussed below, provided to the chip via software and an LLV controller.

Figure 5:
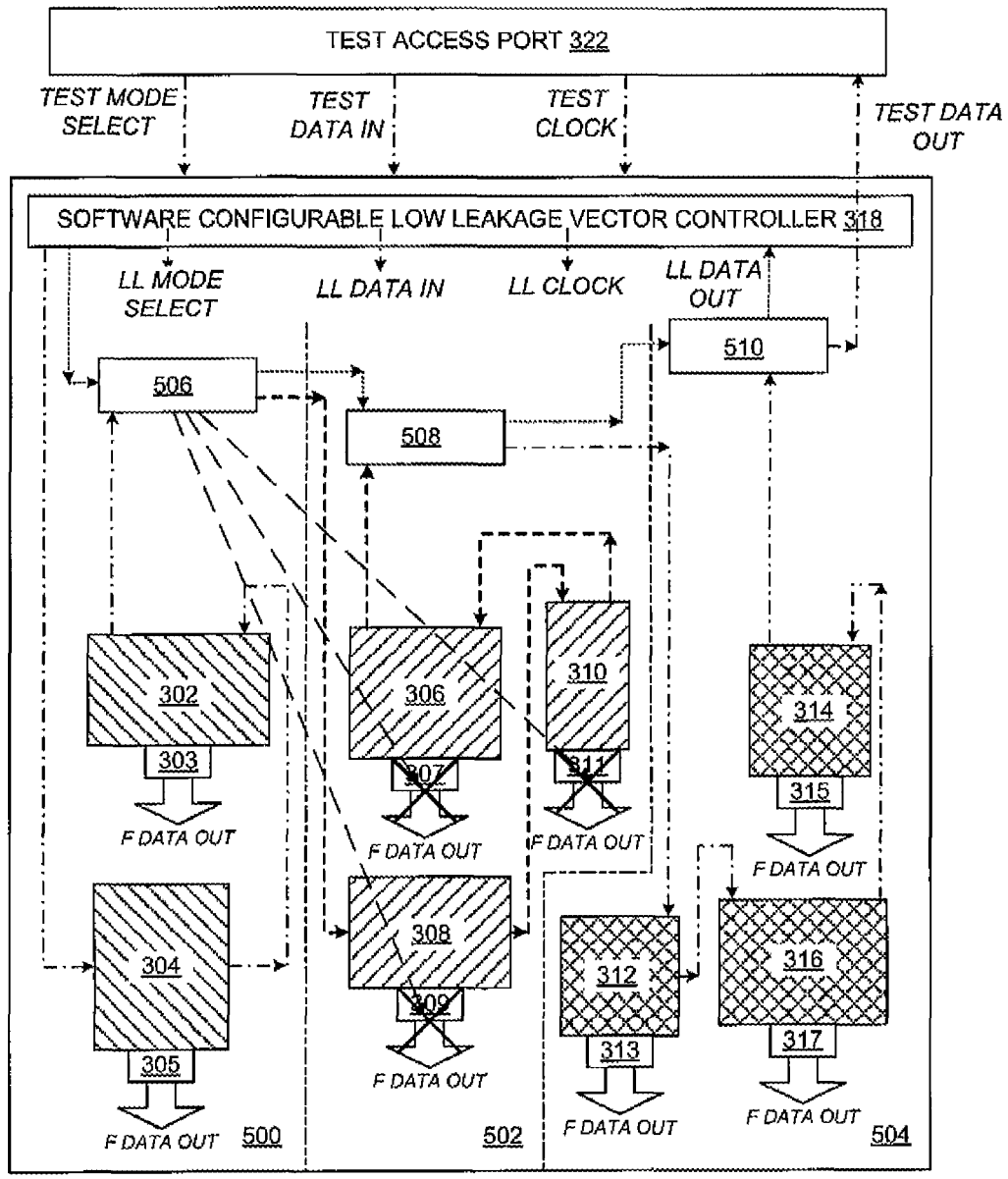
FIG. 5 is a schematic block diagram of the apparatus of FIG. 3 with inactive elements of the IC in low-leakage current mode of operation.

Referring now to FIGS. 3 to 5, an IC 300 including circuitry 320 having a low leakage current mode of operation in accordance with one embodiment of the invention, given by way of example, is illustrated. The circuitry 320 includes a plurality of modules 302-316 (modules identified with even numbers) that implement specific logic functions and/or for running respective applications. Each of the modules 302-316 comprises respective cells and respective test scan chain elements. The circuitry 320 also includes a low leakage vector controller 318 for configuring at least one active module of the plurality of modules 302-316 to operate in a functional mode and at least one selected inactive module of the plurality of modules 302-316 to operate in a low leakage current mode. Configuring the selected inactive module to operate in low leakage current mode comprises enabling the scan chain elements of the selected inactive module, and applying a low leakage vector of input signals from the controller 318 to the cells of the inactive module by way of the scan chain.

In one embodiment of the present invention, the power supply for the modules 302-316 is not interrupted when a selected inactive module is configured in low leakage current mode. The active module or modules of the plurality of modules 302-316 can therefore continue normal operation without switching the power supply to the inactive module or modules. The input signals of the low leakage vector are chosen as a function of the configuration of the selected inactive module so as to maintain the selected inactive module in a state with a low and preferably the lowest, or one of the lowest, leakage currents based on the different possible combinations of cell input signals.

Figure 1:
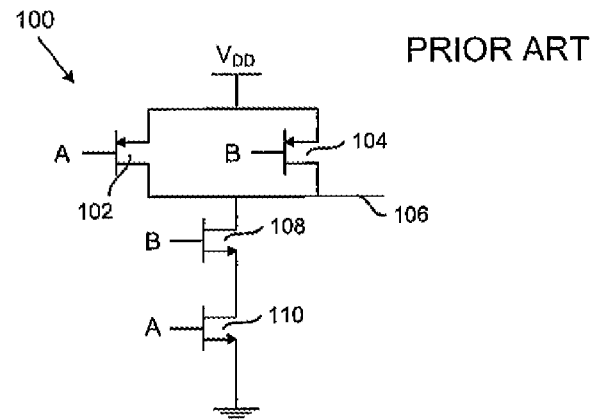
FIG. 1 is a schematic circuit diagram of a conventional standard cell.
Figure 2:
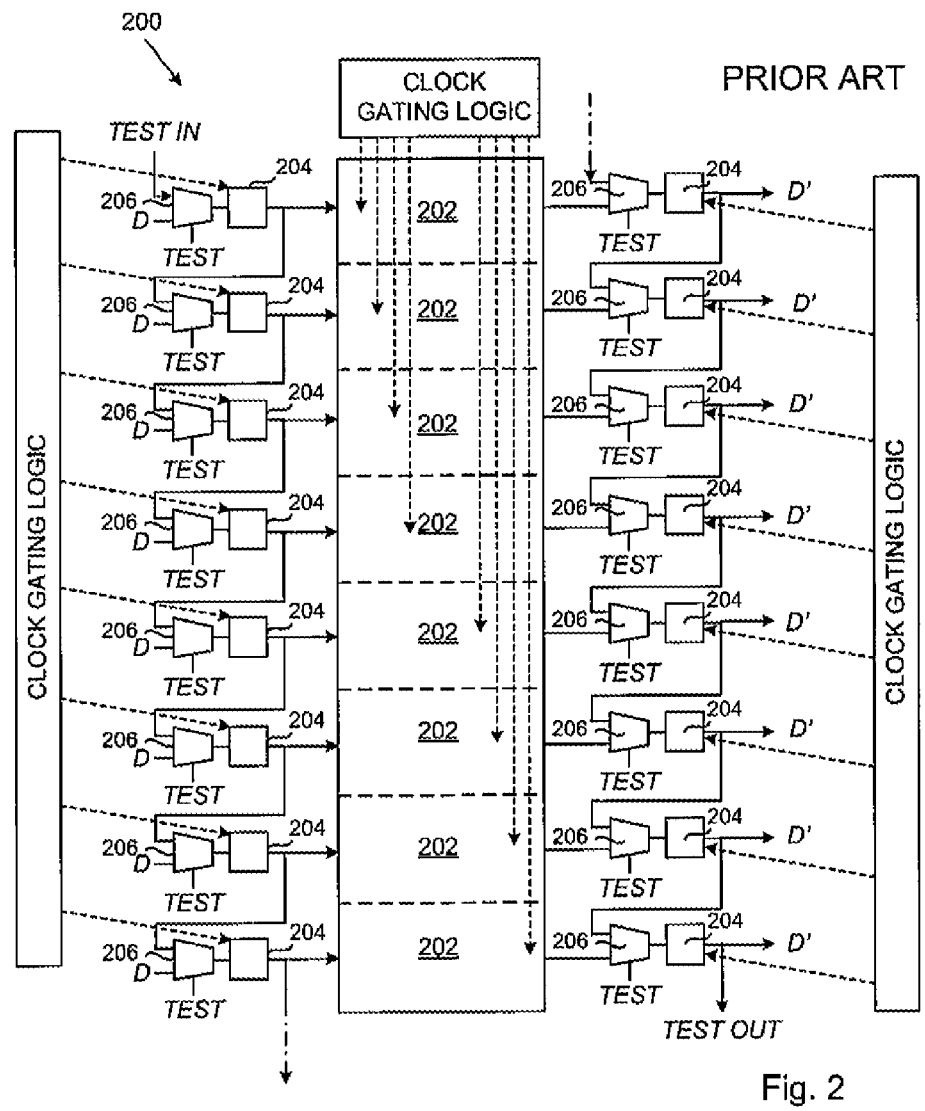
FIG. 2 is schematic block diagram of a conventional application module in an IC with a test scan chain.

The modules 302-316 may be like the modules 200 shown in FIG. 2, for example, having respective functional data inputs and outputs. The controller 318 can disable the functional data outputs of the inactive module or modules during operation in the low leakage current mode. In the preferred embodiment, the modules 302-316 have respective gates 303-317 for disabling ('gating') the functional data outputs of the associated inactive module.

The IC 300 also has a test access port 322 coupled to the controller 318. During scan testing, the test access port 322 communicates with the scan chain elements of the modules 302-316, as shown by dotted lines. The scan test communication with the scan chain elements may comply with the JTAG protocols, although other test procedure communication protocols may be used. The controller 318 includes memory and a processing unit for accessing the memory and reading stored low leakage current vectors for the modules 302-316, enabling the modules 302-316 to operate in functional mode or low leakage current mode, and enabling the gates 303-317 to gate the output signals of the modules 302-316. In functional mode, the controller 318 generates a low leakage mode select signal LL MODE SELECT, a low leakage data input vector signal LL DATA IN, and a low leakage clock signal LL CLOCK and receives from the scan chains of the modules 302-316 a low leakage data output signal LL DATA OUT. The signals LL MODE SELECT, LL DATA IN, LL CLOCK and LL DATA OUT are similar in format and protocol to the scan test procedure signals TEST MODE SELECT, TEST DATA IN, TEST CLOCK and TEST DATA OUT. The signals LL MODE SELECT, LL DATA IN, LL CLOCK and LL DATA OUT are stored in the memory of the controller 318 and define the low leakage vector and control or configuration parameters for different combinations of inactive modules. The low leakage vector may be loaded into the memory of the controller 318, in one or multiple iterations, from an off-IC memory depending on the length of the scan chain and controller's low leakage vector memory depth.

As shown in FIG. 4, in this example, the memory of the controller 318 is configurable via software and includes a control register 400 and a low leakage vector register 402, which in this case is 32-bits. The control register 400 controls disabling of the outputs of the inactive modules 302-316 using the gates 303-317, selective gating of the functional clocks for the inactive modules, and the scan configuration (i.e., scan enabled or disabled) of the inactive modules. The low leakage vector register 402 stores low leakage data input signals LL DATA IN corresponding to different low leakage vectors for each of the modules 302-316 and for different combinations of the modules. The controller 318 also includes a register 404 for storing the length LLV LENGTH of the low leakage vectors. The controller 318 also has a clock generator 406 that provides the low leakage scan clock signal LL CLOCK by scaling the frequency of the functional system clock signal CLK. The controller 318 also has a finite state machine (FSM) 408.

The low leakage data input signal LL DATA IN is a serialized form of the low leakage vector of the scan chains of the inactive modules. The FSM 408 selects the inactive module or modules that are to be configured in low leakage mode and the corresponding low leakage vectors as a function of indications from the system controller (not shown). Based on the configuration in the control register 400, the FSM 408 causes the functional system clock signal CLK for the inactive module or modules to be interrupted and also enables the scan chains of the inactive module or modules for communication of the signals LL DATA IN and LL DATA OUT with the controller 318, instead of with the functional data inputs and outputs. If the length of the low leakage data input signal LL DATA IN is greater than the capacity of the low leakage vector register 402, in this case 32-bits, two or more iterations may be necessary to shift in the whole low leakage data input signal LL DATA IN. However, if the length of the low leakage data input signal LL DATA IN is less than or equal to the capacity of the low leakage vector register 402, the low leakage data input signal LL DATA IN can be shifted in in a single operation.

FIG. 5 illustrates an example of the circuitry 320, in which the modules 302 and 304 are part of a first specific application 500 and the modules 306, 308 and 310 are part of a second specific application 502. The first and second applications 500 and 502 can be configured temporarily or for extensive periods of time in low leakage mode. The modules 312, 314 and 316 are part of a third basic application 504 such that the modules 312-316 cannot be configured in low leakage current mode.

In FIG. 5, the controller 318 is connected to scan control logic elements 506, 508 and 510, which control the scan chains of the modules being used for the applications 500, 502 and 504 respectively. The scan chains of the modules used by the applications 500, 502 and 504 are connected in series, with the scan input of the first scan chain of the application and the scan output of the last scan chain of the application connected to the respective scan control logic element 506, 508 or 510. The scan chains and scan control logic elements 506, 508 and 510 used for the low leakage mode are the same as for scan test operations.

FIG. 5 shows an example of partial low leakage operation of the circuitry 320 and the controller 318 in which the applications 500 and 504 are active and are supplied with the functional system clock CLK and normal power supply. However, the application 502 is inactive, and therefore the functional system clock CLK for the modules 306 and 308 is interrupted because these modules are inactive and for this example, designated for low leakage mode. In this embodiment, the normal power supply is provided to the modules 306 and 308, which simplifies the hardware of the circuitry 320. The scan chains, shown in dotted lines, of the modules executing the applications 500 and 504 are inactive, while the scan chain, shown in dashed lines, of the modules 306, 308, 310 that are executing application 502 is active (and these modules are inactive) and communicates with the controller 318 through the scan control logic element 508. The low leakage mode select signal LL MODE SELECT, the low leakage data input signal LL DATA IN, the low leakage clock signal LL CLOCK, and the low leakage data output signal LL DATA OUT are transmitted between the scan control logic elements 506, 508 and 510 as shown in dotted lines. Accordingly, the controller 318 can configure the inactive modules 306-310 of the application 502 in low leakage mode and the modules of the active applications 500 and 504 in functional mode.

In this example, the scan chains of the inactive modules 302-316 are connected together as a single scan chain and respective low leakage vectors of input signals are applied to the cells of each of the inactive modules through the single scan chain. However, in an alternative embodiment, the low leakage vectors for each of the inactive modules that are placed in the low leakage mode are issued separately to each module using just the scan chain of the respective module. That is, the controller 318 can access the scan chain of each of the modules 302-316 individually.

In this example, the functional data outputs F DATA OUT of the inactive module placed in the low current mode are disabled using the respective gate 303-317 of the inactive module. However, in an alternative embodiment of the invention, multiplexers of the scan chain elements of the inactive module or modules 302-316 interrupt the functional data outputs, thereby providing the same effect.

In this example, the controller 318 recovers the output signals LL DATA OUT from the scan chain while applying the low leakage vector of input signals to the cells of the inactive module designated for low leakage current mode. The output signals LL DATA OUT are representative of functional input signals during a previous active state of the inactive module. When the inactive module is switched from the low leakage current mode to active, functional mode, the controller 318 restores the inactive module to the functional mode, and re-applies the output signals LL DATA OUT representative of a previous active state of the module to the inputs of the inactive module. However, in another embodiment, restoration of the inactive module to a previous active state is omitted, notably if the selected inactive module is of a type that does not require such restoration.

The invention may be implemented partially in a computer program for running on a computer system, at least including code portions for performing steps of a method according to the invention when run on a programmable apparatus, such as a computer system or enabling a programmable apparatus to perform functions of a device or system according to the invention. A computer program is a list of instructions such as a particular application program and/or an operating system. The computer program may for instance include one or more of: a subroutine, a function, a procedure, an object method, an object implementation, an executable application, an applet, a servlet, source code, object code, a shared library/dynamic load library and/or other sequence of instructions designed for execution on a computer system. Such programmed instructions also could be implemented in firmware, as will be understood by those of skill in the art.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals. The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations are merely illustrative. Multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, the word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit, comprising:
a plurality of modules for performing a plurality of applications, each of said plurality of modules having a plurality of cells and a plurality of scan test elements that form a scan chain, wherein when at least one of said plurality of applications is being performed at least one of said modules is operating in a functional mode and at least one of said modules is inactive; and
a controller for configuring the at least one inactive module of said plurality of modules to operate in a low leakage current mode while the at least one module of said plurality of modules is operating in the functional mode, wherein configuring the inactive module to operate in said low leakage current mode comprises applying a low leakage vector of input signals from said controller to said plurality of cells of said inactive module by way of said scan chain of the inactive module, and
wherein said controller further comprises a clock generator that provides a low leakage scan clock signal to the inactive module to load the low leakage vector into said scan test elements of said inactive module.

2. The integrated circuit of claim 1, wherein said controller includes a memory for storing said low leakage vector.

3. The integrated circuit of claim 2, wherein said memory also stores configuration parameters for different combinations of inactive modules.

4. The integrated circuit of claim 3, wherein said controller is operative to recover output signals from said scan chain of the at least one inactive module while applying said low leakage vector of input signals to said plurality of cells of the at least one inactive module, said output signals being representative of functional input signals during a previous functional mode of the at least one inactive module, to restore the at least one inactive module to said previous functional mode, and to re-apply said output signals representative of said previous functional mode through said scan chain to inputs of the at least one inactive module when restoring the at least one inactive module to said previous functional mode.

5. The integrated circuit of claim 3, wherein said controller is operable to configure a selected plurality of inactive modules to operate in said low leakage current mode, including connecting said scan test elements of said selected plurality of inactive modules in a single scan chain and applying a respective low leakage vector of input signals to said plurality of cells of each of the modules of said selected plurality of inactive modules through said single scan chain.

6. The integrated circuit of claim 1, wherein each of said plurality of modules has functional data inputs and outputs, the integrated circuit further comprising:
a plurality of gating logic elements, wherein each of the plurality of modules is coupled with one of the gating logic elements, and wherein said controller disables said functional data outputs of the at least one inactive module using said gating logic elements coupled to the at least one inactive module while the at least one inactive module is in said low leakage current mode.

7. The integrated circuit of claim 1, further comprising a power supply for supplying power to said plurality of modules, wherein the at least one inactive module operating in said low leakage current mode continues to receive power from said power supply.

8. A method of low leakage current operation of an integrated circuit, the integrated circuit having a plurality of modules for performing a plurality of applications, each of said plurality of modules having a plurality of cells and a plurality of scan test elements connected in at least one scan chain, and a clock generator for generating scan clock signals, the method comprising:
configuring, with a controller of the integrated circuit, at least one active module to operate in a functional mode and at least one inactive module to operate in a low leakage current mode;
applying a low leakage vector of input signals from said controller to said plurality of cells of said inactive module through said scan chain of said inactive module, wherein the scan clock signals are supplied to the inactive module in order to load the low leakage vector into the scan test elements of the inactive module.

9. The method of claim 8, wherein each of said plurality of modules has functional data inputs and outputs, the method further comprising disabling said functional data outputs of said inactive module during operation in said low leakage current mode.

10. The method of claim 8, wherein said controller includes a memory, the method further comprising reading the low leakage vector of input signals from said memory.

11. The method of claim 10, wherein said memory stores configuration parameters for different combinations of inactive modules, said configuration parameters for enabling said plurality of modules to operate in said functional mode and said low leakage current mode.

12. The method of claim 8, further comprising:
recovering output signals from said scan chain while applying said low leakage vector of input signals to said plurality of cells of said inactive module, said output signals being representative of functional input signals during said previous functional mode of said inactive module;
restoring said inactive module to said previous functional mode; and
re-applying said output signals representative of said previous functional mode through said scan chain to inputs of said inactive module when restoring said inactive module to said previous functional mode.

13. The method of claim 8, wherein a selected plurality of said inactive modules are configured to operate in said low leakage current mode, including connecting said scan test elements of said selected plurality of said inactive modules in a single scan chain and applying a respective low leakage vector of input signals to said plurality of cells of each of said inactive modules through said single scan chain.

14. The method of claim 8, further comprising supplying power to each of said plurality of modules, wherein the supply of power is provided to both active modules in functional mode and inactive modules in low leakage current mode.

* * * * *